(12) United States Patent
Hanas et al.

(10) Patent No.: US 6,282,101 B1
(45) Date of Patent: *Aug. 28, 2001

(54) EMI/ESD SHIELDING ASSEMBLY FOR AN ELECTRONIC SYSTEM

(75) Inventors: Christopher P J Hanas, Westfield; Liang Hwang, Old Bridge, both of NJ (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/309,930

(22) Filed: May 11, 1999

(51) Int. Cl.[7] ...................................... H05K 9/00
(52) U.S. Cl. .................... 361/818; 361/752; 361/756; 361/759; 361/801
(58) Field of Search .................... 361/752, 753, 361/799, 800, 816, 818, 726, 727, 731, 732, 736, 740, 741, 747, 748, 754, 756, 758, 759, 801, 802; 174/35 R, 35 GC, 35 TS, 35 MS, 51

(56) References Cited

U.S. PATENT DOCUMENTS

| | | | | |
|---|---|---|---|---|
| 4,857,668 | * | 8/1989 | Buonanno | 174/35 GC |
| 5,233,507 | * | 8/1993 | Gunther et al. | 361/818 |
| 5,930,120 | * | 7/1999 | Gunther et al. | 361/800 |
| 6,185,106 | * | 2/2001 | Mueller | 361/798 |

* cited by examiner

*Primary Examiner*—Jeffrey Gaffin
*Assistant Examiner*—Phuong T. Vu
(74) *Attorney, Agent, or Firm*—David L. Davis

(57) ABSTRACT

An assembly for improving the shielding of an electronic system from electromagnetic interference radiation and electrostatic discharge includes a U-shaped conductive bracket as part of the face plate assembly secured to an edge of a circuit card. A conductive latch member is pivotably mounted on the bracket and extends through open slots in the bracket. A conductive gasket is provided on one side of each bracket to engage the opposite side of the bracket of an adjacent face plate assembly. Other conductive gaskets slidingly engage the latch member and seal the slots in the bracket.

7 Claims, 5 Drawing Sheets

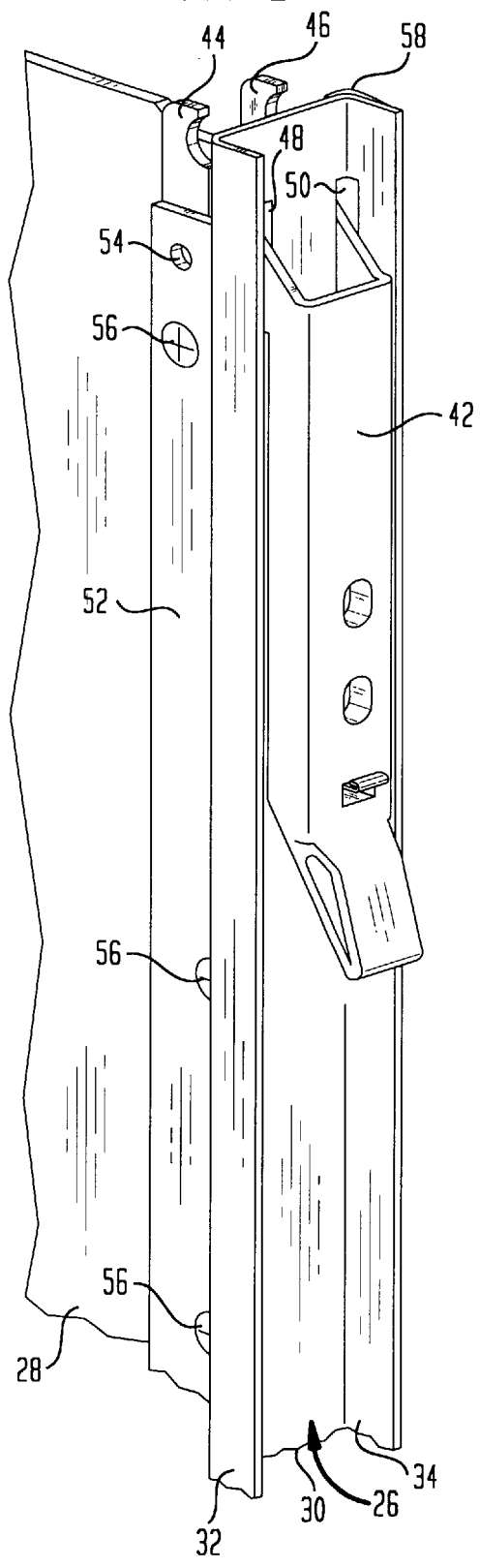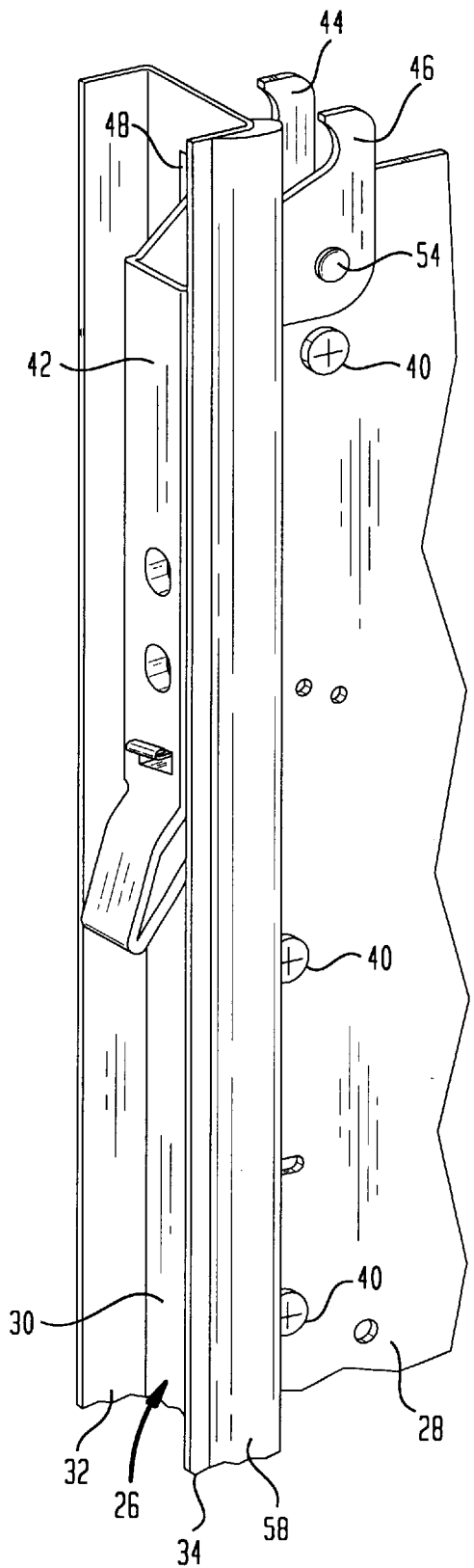

EMI/ESD SHIELDING ASSEMBLY FOR AN ELECTRONIC SYSTEM

BACKGROUND OF THE INVENTION

This invention relates to the provision of electromagnetic interference and electrostatic discharge shielding of an electronic system.

Modern electronic systems equipment, such as for telecommunications purposes, is often constructed as modular circuit packs inserted into guide slots of mechanical card cages, or shelf units, for engagement with a backplane mounted to the shelf unit at the inward ends of the guide slots. The outward edge of each circuit card is fastened to a face plate assembly which holds a latch for releasably retaining the circuit card in the shelf unit. Although the circuit cards are relatively closely packed, there are still gaps between adjacent face plate assemblies. There are also gaps in the face plate assemblies to allow portions of the latches to pass therethrough. All of these gaps allow electromagnetic interference radiation to leak therethrough. In addition, the gaps allow electrostatic discharge to pass therethrough, possibly causing damage to circuit components mounted on the circuit cards. A need therefore exists to provide shielding against electromagnetic interference and electrostatic discharge for such electronic systems equipment.

It is known to provide such shielding by encasing the electronic components within a conductive housing. While this "closed door" approach is satisfactory, there exists a need to provide such shielding under "open door" conditions, for example where a door to the enclosure is open to allow access to the equipment for maintenance purposes.

SUMMARY OF THE INVENTION

According to the present invention, the face plate assemblies secured to each of the circuit cards includes an elongated conductive U-shape bracket member extending at least the length of the circuit card edge with the base wall of the U-shape being orthogonal to the circuit card. Secured to one side wall of each of the bracket members is a respective resilient compressible conductive gasket member which extends the length of its respective bracket member. Each bracket member has its respective gasket member secured to the same corresponding side wall as all the other bracket members so that between each adjacent pair of bracket members there is a single respective gasket member. This seals all the gaps between adjacent face plate assemblies.

In accordance with an aspect of this invention, a plurality of conductive latch members are each pivotably mounted to a respective one of the bracket members. Each latch member includes at least one planar latch hook adapted to engage cooperating structure of the shelf unit holding the circuit card. Each bracket member has its base wall formed with at least one open slot for receiving therethrough a respective latch hook so that the latch hook is parallel to the circuit card and on the same side of the bracket member as the circuit card. The gasket member extends around the bracket member to slidingly engage a side of the latch hook and cover a portion of the respective open slot.

BRIEF DESCRIPTION OF THE DRAWINGS

The foregoing will be more readily apparent upon reading the following description in conjunction with the drawings in which like elements in different figures thereof are identified by the same reference numeral and wherein:

FIGS. 2–4 are partial perspective views from different angles of a face plate assembly according to the present invention;

DETAILED DESCRIPTION

Figure 1:
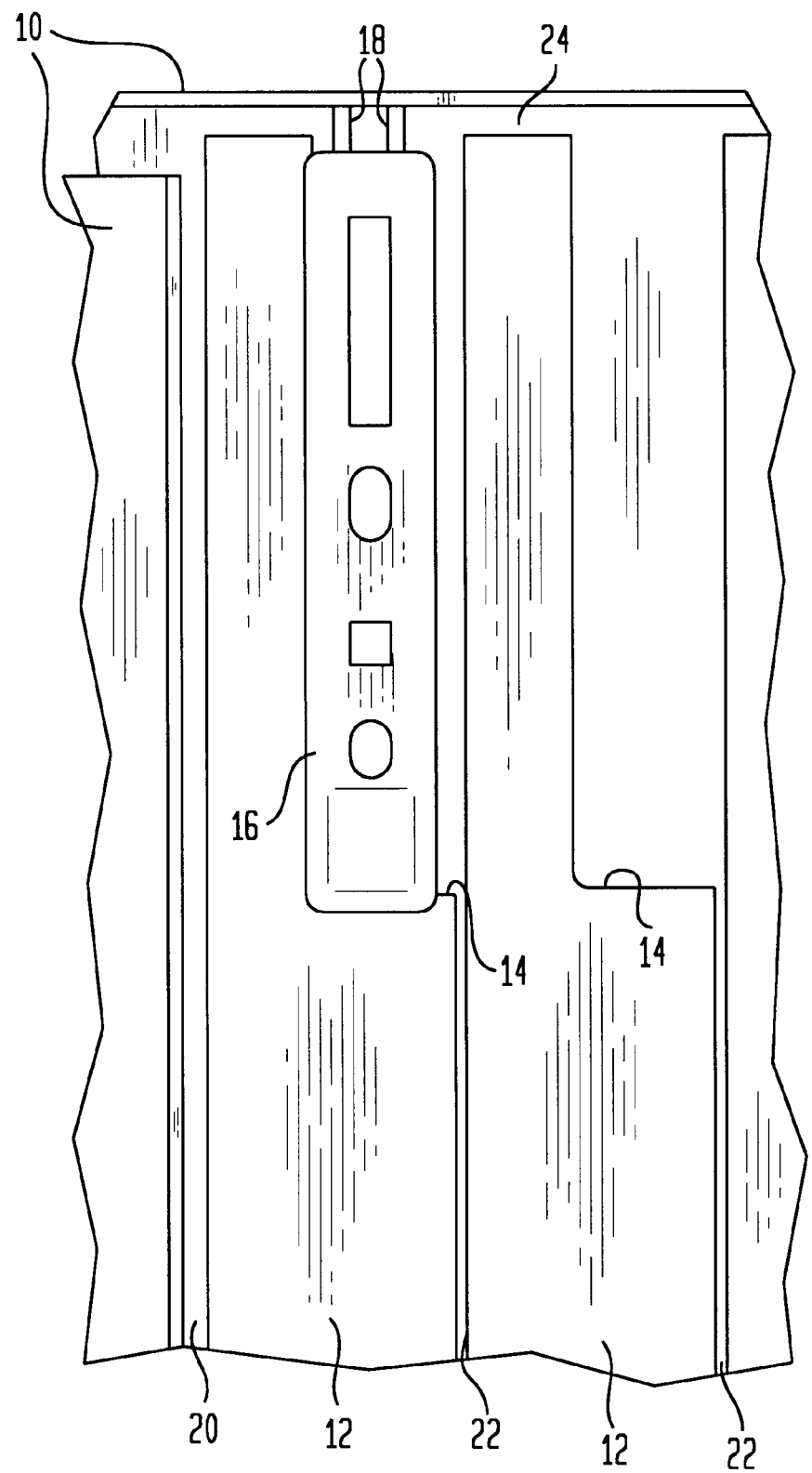
FIG. 1 is an elevational view of a portion of a prior art shelf unit showing an array of prior art face plate assemblies, with one of the latches removed.

FIG. 1 shows a portion of a prior art electronic system wherein a card cage, or shelf unit, 10 holds a plurality of circuit cards (not shown in FIG. 1). Each circuit card has its outward edge secured to a respective face plate 12. Each face plate 12 is formed with an enlarged opening 14 through which is installed a pivoting latch assembly including a latch handle 16 and a pair of latch hooks 18. In FIG. 1, the latch assembly is only shown for the leftmost face plate 12, it being understood that all face plates 12 have a latch assembly in order to retain the circuit card within the shelf unit 10. The latch hooks 18 cooperate with structure of the shelf unit 10 to retain the circuit card in position, with the latch handle 16 being pivoted to release the latch hooks 18 from the cooperating structure of the shelf unit 10 in order to remove or install the circuit card.

As is clear from FIG. 1, there are many gaps through which electromagnetic interference can radiate. Thus, there is a gap 20 between the side of the shelf unit 10 and the leftmost face plate 12. There is a gap 22 between each pair of adjacent face plates 12. There is a gap 24 between the top edges of the face plates 12 and the shelf unit 10. There is a gap (not shown) between the bottom edges of the face plates 12 and the shelf unit 10. There is also a gap where the latch handle 16 does not entirely cover the opening 14. These gaps not only allow electromagnetic interference to radiate therethrough, they also allow the circuit components on the circuit cards to be vulnerable to damage by electrostatic discharge. It had previously been thought that point contact between metallic surfaces to form a connection to ground was sufficient protection against electrostatic discharge. Testing has confirmed that minute air gaps can allow the propagation of electrostatic discharge, as well as electromagnetic interference radiation. The present invention eliminates the unwanted gaps while preserving the geometry of the circuit cards, so that the new design is retrofittable with respect to the circuit cards to avoid requiring a redesign thereof, and also does not require a redesign of the shelf unit.

Figure 4:
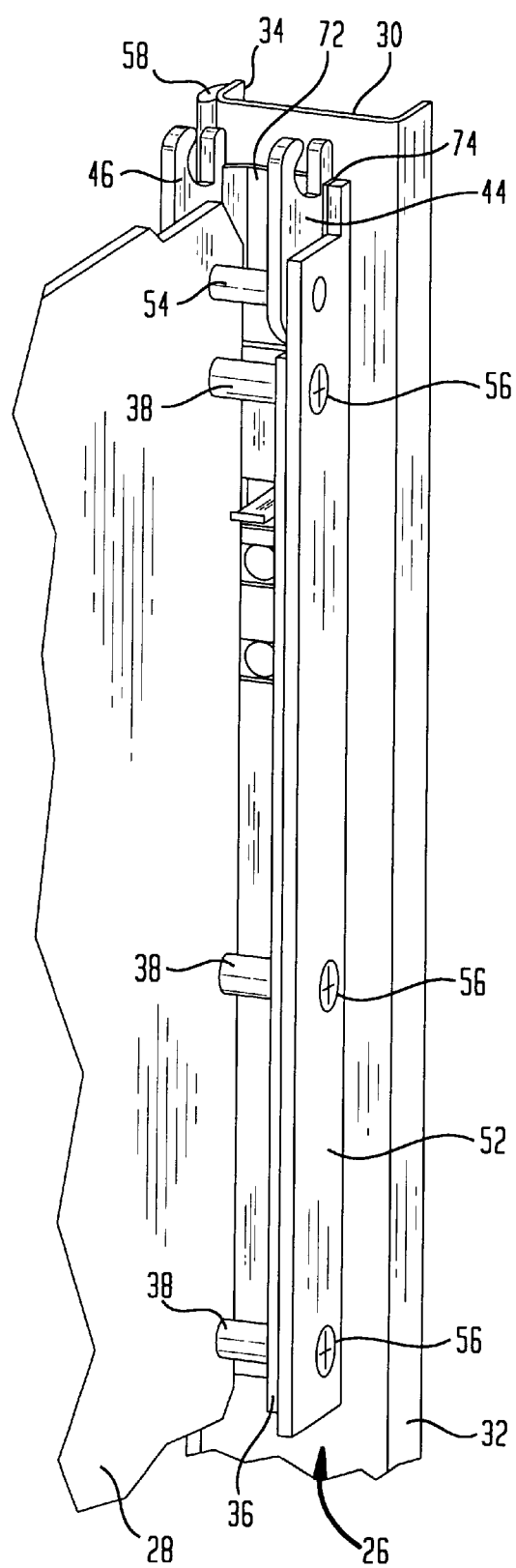

Briefly, according to the present invention, the gaps are filled by providing conductive gaskets. However, in order to provide gaskets between the face plates 12, the face plates have to be redesigned. Thus, the new face plates require sides extending parallel to the circuit card so that there is a surface on a first face plate to hold a gasket and an opposing surface on an adjacent face plate to engage the gasket. However, as previously discussed, an objective of the present invention is to avoid redesigning the circuit cards. Therefore, these required surfaces cannot extend adjacent the circuit cards where they might interfere with a circuit component mounted thereon. Thus, as shown in FIGS. 2–4, the inventive face plate assembly includes an elongated conductive U-shaped bracket member 26 which extends at least the length of the circuit card 28. To avoid the afore-described problem of the sides of the face plate interfering with circuit components on the circuit card 28, the bracket member 26 is arranged with its base wall 30 being orthogonal to the circuit card 28 and its side walls 32, 34 extending parallel to and away from the circuit card 28. To attach the bracket member 26 to the circuit card 28, an L-shaped bracket 36 (FIG. 4) is secured to the base wall 30, as by spot welding or the like. The bracket 36 has a plurality of standoffs 38 press fit therein. The circuit card 28 is placed at the distal end of the standoffs 38 and secured thereto by screws 40 extending through suitably placed openings in the circuit card.

Pivotably mounted to the bracket member 26 is a conductive latch member including a latch handle portion 42 and a pair of latch hooks 44, 46. The latch hooks 44, 46 perform the same function as the latch hooks 18 (FIG. 1) and are configured and positioned the same relative to the circuit card 28 so that they engage the same cooperating structure of the shelf unit 10. For mounting the latch member, the base wall 30 of the bracket member 26 is formed with a pair of open slots 48, 50. The latch hooks 44, 46 are inserted through the slots 48, 50, respectively. A plate member 52 is provided with a pivot pin 54 press fit therein. The pivot pin 54 extends through holes provided therefor in the latch hooks 44, 46 and the circuit card 28, as shown in FIG. 4. The plate member 52 is then secured to the standoffs 38 by the screws 56.

As described so far, unwanted gaps are still present. To fill those gaps, conductive foam gaskets are provided in accordance with the present invention. A first conductive gasket 58 is secured to each side wall 34. As shown in FIG. 6, the gasket 58 includes a urethane foam interior 60 covered by conductive fabric 62. To add rigidity to the gasket 58, a polycarbonate insert 64 is molded into the foam 60. To secure the gasket 58 to the side wall 34, a strip of adhesive material 66 is provided. The foam 60 is shaped so that on the side away from the side wall 34 the gasket 58 is generally triangular, with its apex 68 extending away from the side wall 34 by a distance greater than the spacing between that side wall 34 and the next adjacent side wall 32. Accordingly, the gasket 58 is compressed to fill the entire space between adjacent side walls 34, 32. On the side of the gasket 58 toward the side wall 34, the gasket 58 is formed with a bulge 70 which wraps around the base wall 30 so as to slidingly engage one side of the latch hook 46 and cover part of the slot 50, as best seen in FIG. 5.

A second conductive gasket 72 is secured to the base wall 30 between the latch hooks 44, 46. The gasket 72 may be made of urethane foam covered by conductive fabric. The gasket 72 slidingly engages the facing sides of the latch hooks 44, 46 and partially covers the slots 48, 50. A third conductive gasket 74 of similar construction is secured to the base wall 30 on the other side of the latch hook 44 from the gasket 72 to slidingly engage the latch hook 44 and partially cover the slot 48.

Figure 5:
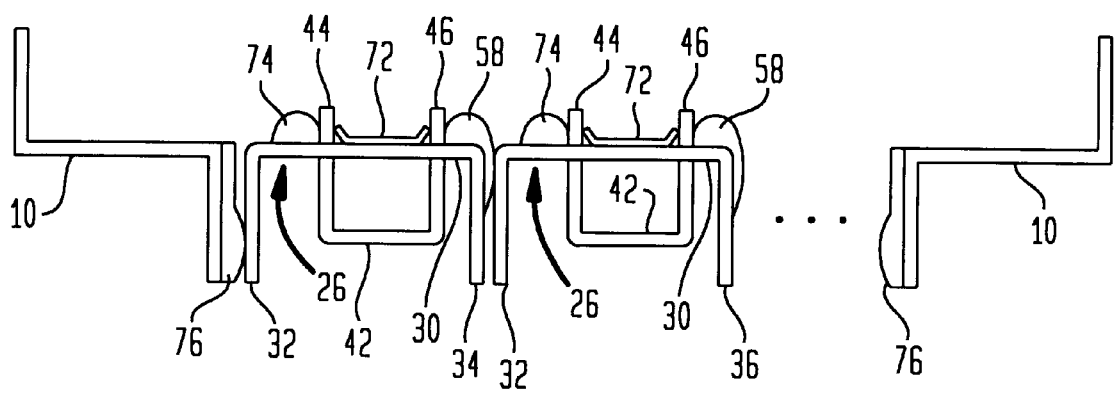
FIG. 5 is a schematic top view of an array of face plate assemblies incorporating the present invention.
Figure 6:
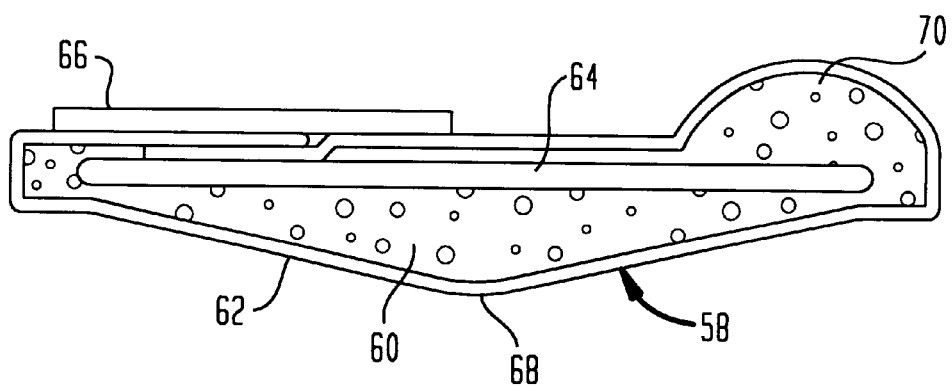
FIG. 6 is a cross sectional view illustrating a gasket member according to the present invention.
Figure 7:
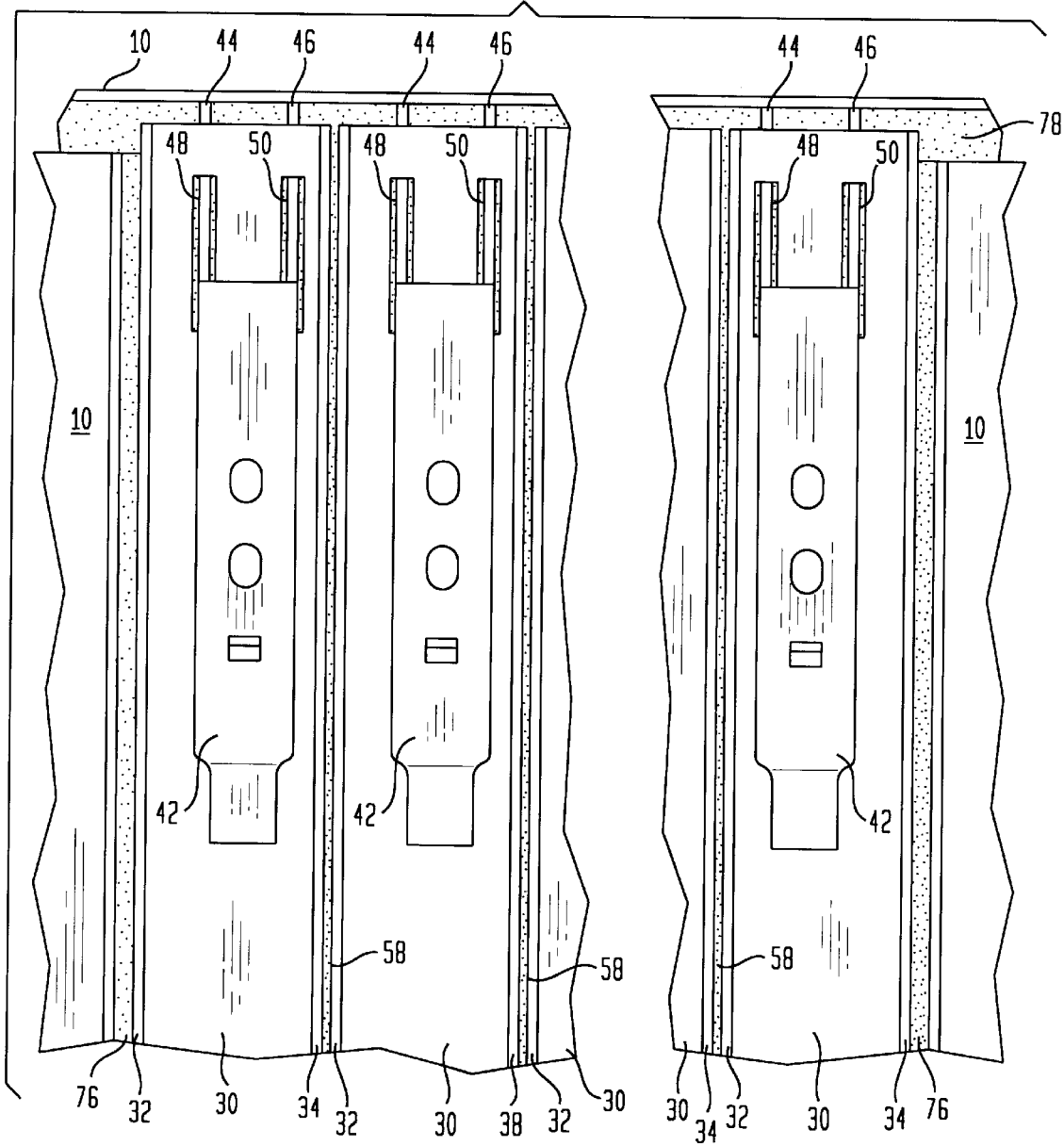
FIG. 7 is an elevational view showing a portion of an array of face plate assemblies according to the present invention mounted in a shelf unit.

In addition to the gaskets 58, 72, 74 secured to the bracket member 26, the shelf unit 10 is provided with conductive gaskets 76 of similar construction along vertical side walls on the shelf unit 10 to engage side walls of the face plates of the circuit cards at the ends of the array, as shown in FIGS. 5 and 7. In addition, a horizontal conductive gasket 78 of similar construction is secured to the top of the shelf unit 10 to engage the upper edges of the bracket members 26 and a similar horizontal conductive gasket (not shown) is secured to the bottom of the shelf unit 10 to engage the lower edges of the bracket members 26.

Accordingly, there has been disclosed an improved shielding assembly which does not require redesign of the shelf unit or the circuit cards. While an illustrative embodiment of the present invention has been disclosed herein, it is understood that various adaptations and modifications to the disclosed embodiment are possible and it is intended that this invention be limited only by the scope of the appended claims.

What is claimed is:

1. An electronic system having a shelf unit holding a plurality of circuit cards side by side in a parallel array and an assembly for shielding the system from electromatic interference and electrostatic discharge, wherein the assembly comprises:
    a plurality of face plate assemblies each secured to an edge of a respective one of said plurality of circuit cards, wherein each of said face plate assemblies is accessible from outside said shelf unit for installing and removing the respective circuit card from the shelf unit, and wherein each of said face plate assemblies includes an elongated conductive U-shaped bracket member extending at least the length of the circuit card edge with the base wall of the U-shape being orthogonal to the circuit card and the two side walls of the U-shape extending parallel to and away from the respective circuit card so as to not overlie the respective circuit card; and
    a plurality of resilient compressible conductive first gasket members each secured to one side wall of a respective bracket member, each first gasket member extending the length of its respective bracket member, wherein each first gasket member in its uncompressed state extends away from its respective bracket member in a direction orthogonal to the one side wall by a distance greater than the spacing between facing bracket member side walls of adjacent circuit card face plate assemblies;
    wherein each bracket member has its respective first gasket member secured to the same corresponding side wall as all the other bracket members so that between each adjacent pair of bracket members there is a single respective first gasket member filling the gap between facing bracket member side walls.

2. The assembly according to claim 1 wherein each of said first gasket members comprises a urethane foam core and a conductive fabric covering said core.

3. The assembly according to claim 2 wherein each of said first gasket members further comprises a rigid elongated member within said core and extending the length of the respective bracket member.

4. The assembly according to claim 1 further comprising:
    a plurality of conductive latch members each pivotably mounted to a respective one of said face plate assemblies and each including at least one planar latch hook adapted to engage said shelf unit to retain the respective circuit card within the shelf unit and a handle portion attached to the at least one latch hook;
    wherein each bracket member has its base wall formed with at least one open slot for receiving therethrough a respective one of said at least one latch hook so that said at least one latch hook is parallel to the respective circuit card and on the same side of the respective bracket member base wall as the respective circuit card, and the handle portion is between the respective bracket member side walls; and
    wherein the respective first gasket member extends around the respective bracket member to slidingly engage a side of the respective at least one latch hook and cover a portion of the respective at least one open slot.

5. The assembly according to claim 4 wherein each of said latch members consists of two parallel latch hooks and each bracket member base wall has two open slots each associated with a respective latch hook, the assembly further comprising for each face plate assembly a conductive second gasket member secured to the respective bracket member base wall between the two open slots and slidingly engaging the two latch hooks, and a conductive third gasket member secured to the respective bracket member base wall to slidingly engage the latch hook not engaged by said first gasket member on the side of said latch hook opposite said second gasket member.

6. The assembly according to claim 1 further comprising:
a conductive fourth gasket member secured to a side of the shelf unit to slidingly engage a side wall of a bracket member at an end of the array of circuit cards.

7. The assembly according to claim 1 further comprising:
a conductive fifth gasket member secured to the shelf unit and extending across the array of circuit cards so as to engage an edge of each of the bracket members in the array.

* * * * *